(12) United States Patent
Na

(10) Patent No.: US 11,418,739 B2
(45) Date of Patent: Aug. 16, 2022

(54) LOCK-IN PIXEL WITH REDUCED NOISE CURRENT AND SENSORS INCLUDING THE SAME

(71) Applicant: Artilux, Inc., Menlo Park, CA (US)

(72) Inventor: Yun-Chung Na, San Jose, CA (US)

(73) Assignee: Artilux, Inc., Menlo Park, CA (US)

( * ) Notice: Subject to any disclaimer, the term of this patent is extended or adjusted under 35 U.S.C. 154(b) by 0 days.

(21) Appl. No.: 17/324,855

(22) Filed: May 19, 2021

(65) Prior Publication Data

US 2021/0392280 A1 Dec. 16, 2021

Related U.S. Application Data

(60) Provisional application No. 63/039,470, filed on Jun. 16, 2020.

(51) Int. Cl.
| | |
|---|---|
| H04N 5/361 | (2011.01) |
| H04N 5/369 | (2011.01) |
| G01S 7/4863 | (2020.01) |
| G01S 7/4865 | (2020.01) |
| G01S 17/10 | (2020.01) |
| H04N 5/374 | (2011.01) |

(52) U.S. Cl.
CPC ........... *H04N 5/361* (2013.01); *G01S 7/4863* (2013.01); *G01S 7/4865* (2013.01); *G01S 17/10* (2013.01); *H04N 5/36965* (2018.08); *H04N 5/374* (2013.01)

(58) Field of Classification Search
CPC ............ H04N 5/335–379; G01S 11/12; G01S 13/08–449
See application file for complete search history.

(56) References Cited

U.S. PATENT DOCUMENTS

| | | | | |
|---|---|---|---|---|
| 2017/0222076 | A1* | 8/2017 | Furrer | H01L 27/1443 |
| 2018/0190698 | A1* | 7/2018 | Na | H01L 27/14612 |
| 2018/0233521 | A1* | 8/2018 | Na | H01L 27/14636 |
| 2019/0267498 | A1* | 8/2019 | Cheng | H01L 31/02024 |
| 2020/0382736 | A1* | 12/2020 | Na | H01L 27/1461 |

* cited by examiner

*Primary Examiner* — Paul M Berardesca
(74) *Attorney, Agent, or Firm* — Fish & Richardson P.C.

(57) ABSTRACT

An optical sensing apparatus includes an absorption region configured to receive an optical signal and to generate, in response to the optical signal, photo-generated electrons and photo-generated holes, a carrier steerer, and circuitry electrically coupled to the carrier steerer and a controller. The carrier steerer includes a first p-doped region, a first n-doped region electrically shorted with the first p-doped region, a first gate configured to control a flow of holes from the absorption region to the first p-doped region, and a second gate configured to control a flow of electrons from the absorption region to the first n-doped region. The circuitry is configured receive electrical signals from the controller to synchronize operation of the first and second gates so that during a first time period holes flow from the absorption region to the first p-doped region while electrons do not flow from the absorption region to the first n-doped region and during a second time period electrons flow from the absorption region to the first n-doped region while holes do not flow from the absorption region to the first p-doped region.

20 Claims, 13 Drawing Sheets

LOCK-IN PIXEL WITH REDUCED NOISE CURRENT AND SENSORS INCLUDING THE SAME

CROSS-REFERENCE TO RELATED APPLICATION

This application claims benefit of priority to U.S. Provisional Application No. 63/039,470, titled "Lock-in Pixel with Zero-Mean Noise Current" and filed Jun. 16, 2020, the entire contents of which is incorporated herein by reference in its entirety.

FIELD OF THE DISCLOSURE

This disclosure relates to lock-in pixels with reduced noise current and sensors and sensor systems including the same.

BACKGROUND

Light sensors, e.g., for visible or infrared light, are ubiquitous in modern electronic devices like mobile phones. Light sensors for imaging applications, such as for cameras, typically utilize complementary metal oxide semiconductor (CMOS) or charge-coupled device (CCD) technologies in which arrays of sensors are built as integrated circuits on a semiconductor chip. One source of noise in a signal from a sensor pixel is dark current, which refers to an electric current (often small) which flows through a device even when no photons are detected. Another source of noise can be ambient or stray light from an environment in which a light sensor is used.

SUMMARY

Various aspects of the disclosure are summarized as follows.

In general, in a first aspect, the disclosure features an optical sensing apparatus that includes (i) an absorption region configured to receive an optical signal and to generate, in response to the optical signal, photo-generated electrons and photo-generated holes; (ii) a carrier steerer that includes a first p-doped region, a first n-doped region electrically shorted with the first p-doped region, a first gate configured to control a flow of holes from the absorption region to the first p-doped region, and a second gate configured to control a flow of electrons from the absorption region to the first n-doped region; and (iii) circuitry electrically coupled to the carrier steerer and a controller, the circuitry configured receive electrical signals from the controller to synchronize operation of the first and second gates so that during a first time period holes flow from the absorption region to the first p-doped region while electrons do not flow from the absorption region to the first n-doped region and during a second time period electrons flow from the absorption region to the first n-doped region while holes do not flow from the absorption region to the first p-doped region.

Implementations of optical sensing apparatus can include one or more of the following features and/or features of other aspects. For example, the carrier steerer can be a first carrier steerer and the optical sensing apparatus can further include a second carrier steerer that includes a second p-doped region, a second n-doped region electrically shorted with the second p-doped region, a third gate configured to control a flow of holes from the absorption region to the second p-doped region, and a fourth gate configured to control a flow of electrons from the absorption region to the second n-doped region. The circuitry can be electrically coupled to the second carrier steerer, the circuitry configured receive electrical signals from the controller to synchronize operation of the third and fourth gates so that during the second time period holes flow from the absorption region to the second p-doped region while electrons do not flow from the absorption region to the second n-doped region and during the first time period electrons flow from the absorption region to the second n-doped region while holes do not flow from the absorption region to second the p-doped region. The circuitry can include a first control circuit, a second control circuit, a third control circuit, and a fourth control circuit, wherein the first gate, the second gate, the third gate, and the fourth gate are electrically coupled to the controller respectively via an output of the first control circuit, an output of the second control circuit, an output of the third control circuit, and an output of the fourth control circuit, and wherein the output of the first control circuit generates a voltage that ranges from zero to a first positive value, the output of the second control circuit generates a voltage that ranges from a first negative value to zero, the output of the third control circuit generates a voltage that ranges from zero to the first positive value, and the output of the fourth control circuit generates a voltage that ranges from the first negative value to zero. The circuitry can be configured receive electrical signals from the controller so that, during the first time period, the output of the first control circuit generates a voltage at zero and the output of the second control circuit generates a voltage at the first negative value, and the output of the third control circuit generates a voltage at the first positive value and the output of the fourth control circuit generates a voltage at zero. The circuitry can be configured receive electrical signals from the controller so that, during the second time period, the output of the first control circuit generates a voltage at the first positive value and the output of the second control circuit generates a voltage at the zero, and the output of the third control circuit generates a voltage at zero and the output of the fourth control circuit generates a voltage at the first negative value.

In some embodiments, the first carrier steerer is coupled to a first readout circuit and the second carrier steerer is coupled to a second readout circuit, the first carrier steerer being configured to provide a first photo-current to the first readout circuit and the second carrier steerer being configured to provide a second photo-current to the second readout circuit, and wherein a polarity of the first photo-current is opposite of a polarity of the second photo-current.

The absorption region can be composed of a first material. The carrier steerer can also be composed of the first material. At least a portion of the carrier steerer can be composed of a second material. The first material can include germanium, and wherein the second material can include silicon. The first material can include germanium or silicon.

The optical sensing apparatus can include multiple pixels, one of the pixels including the absorption region and the carrier steerer.

In another aspect, the disclosure can feature a time-of-flight sensor includes an emitter and the optical sensing apparatus.

In a further aspect, the disclosure can feature a mobile device that includes the optical sensing apparatus.

In general, in another aspect, the disclosure features a light detection method, including: (i) during a first time period, configuring a first carrier steerer to direct holes created in an absorption region of an optical sensor to flow from the absorption region to a first p-doped region of the optical sensor and prevent electrons created in the absorption region from flowing from the absorption region to a first n-doped region of the optical sensor, the first n-doped region being electrically shorted with the first p-doped region; (ii) during a second time period, configuring the first carrier steerer to direct electrons created in the absorption region to flow from the absorption region to the first n-doped region and prevent holes created in the absorption region from flowing from the absorption region to the first p-doped region; (iii) receiving electrical signals from the optical sensor during the first and second times in response to the holes flowing to the first p-doped region during the first time period and the electrons flowing to the first n-doped region during the second time period; and (iv) processing the received electrical signals.

Implementations of the method can include one or more of the following features and/or features of other aspects. For example, the method can include, during the first time period, configuring a second carrier steerer to prevent holes created in the absorption region from flowing from the absorption region to a second p-doped region of the optical sensor and direct electrons created in the absorption region to flow from the absorption region to a second n-doped region of the optical sensor, the second n-doped region being electrically shorted with the second p-doped region; and during the second time period, configuring the second carrier steerer to direct holes created in the absorption region to flow from the absorption region to the second n-doped region and prevent electrons created in the absorption region from flowing from the absorption region to the second p-doped region, wherein the electrical signals from the optical sensor are further in response to the electrons flowing to the second n-doped region during the first time period and the holes flowing to the second p-doped region during the second time period.

The first and second time periods can be equal in length and can be repeated multiple times.

The method can include periodically emitting light towards an object in synchrony with the first and second time periods, wherein at least a portion of the light emitted during the first time period is reflected from the object and received at the absorption region during the second time period. Processing the received electrical signals can further include determining information about a distance between the object and the optical sensor.

In general, in another aspect, the disclosure features an optical sensing apparatus that includes an absorption region configured to receive an optical signal and to generate, based on the optical signal, photo-generated electrons and photo-generated holes, and first and second carrier steerers. The first carrier steerer includes a first p-doped region and a first n-doped region electrically shorted with the first p-doped region, a first gate configured to control a flow of a portion of the photo-generated holes to the first p-doped region, and a second gate configured to control a flow of a portion of the photo-generated electrons to the first n-doped region. The second carrier steerer includes a second p-doped region, a second n-doped region electrically shorted with the second p-doped region, a third gate configured to control a flow of a portion of the photo-generated holes to the second p-doped region, and a fourth gate configured to control a flow of a portion of the photo-generated electrons to the second n-doped region.

Implementations of the optical sensing apparatus can include one or more of the following features and/or features of other aspects. For example, the first gate, the second gate, the third gate, and the fourth gate can be electrically coupled to an output of a first control circuit, an output of a second control circuit, an output of a third control circuit, and an output of a fourth control circuit, respectively. The output of the first control circuit generates a voltage that ranges from zero to a first positive value, the output of the second control circuit generates a voltage that ranges from a first negative value to zero, the output of the third control circuit generates a voltage that ranges from zero to the first positive value, and the output of the fourth control circuit generates a voltage that ranges from the first negative value to zero. The first carrier steerer can be configured to collect a portion of the photo-generated holes when the output of the first control circuit generates a voltage at zero and the output of the second control circuit generates a voltage at the first negative value, and the second carrier steerer can be configured to collect a portion of the photo-generated electrons when the output of the third control circuit generates a voltage at the first positive value and the output of the fourth control circuit generates a voltage at zero. The first carrier steerer can be configured to collect a portion of the photo-generated electrons when the output of the first control circuit generates a voltage at the first positive value and the output of the second control circuit generates a voltage at the zero, and the second carrier steerer can be configured to collect a portion of the photo-generated holes when the output of the third control circuit generates a voltage at zero and the output of the fourth control circuit generates a voltage at the first negative value.

The first carrier steerer can be coupled to a first readout circuit, and the second carrier steerer can be coupled to a second readout circuit. The first carrier steerer can be configured to provide a first photo-current to the first readout circuit, and the second carrier steerer can be configured to provide a second photo-current to the second readout circuit. A polarity of the first photo-current can be opposite of a polarity of the second photo-current.

The absorption region can be composed of a first material. The first carrier steerer and the second carrier steerer can be composed from the first material. In some embodiments, at least a portion of the first carrier steerer and a portion of the second carrier steerer are formed using a second material, different from the first material. The first material can include germanium, and wherein the second material include silicon. In some embodiments, first material contains germanium or silicon.

The optical sensing apparatus can be a direct time-of-flight sensor or an indirect time-of-flight sensor.

In certain embodiments, the optical sensing apparatus includes a first readout circuit and a second readout circuit.

The optical sensing apparatus can include a first control circuit, a second control circuit, a third control circuit, and a fourth control circuit.

In some embodiments, the optical sensing apparatus is a mobile device.

In general, in a further implementation, the disclosure features an optical sensing apparatus that includes an absorption region configured to receive an optical signal and to generate, based on the optical signal, photo-generated electrons and photo-generated holes, a first readout circuit and a second readout circuit, a first control circuit, a second control circuit, a third control circuit, and a fourth control circuit. The optical sensing apparatus also includes a first carrier steerer coupled to the first readout circuit and a second carrier steerer coupled to the second readout circuit. The first carrier steerer includes a first p-doped region, a first n-doped region electrically shorted with the first p-doped region, a first gate coupled to the first control circuit, the first gate configured to control a flow of a portion of the photo-generated holes to the first p-doped region, and a second gate coupled to the second control circuit, the second gate configured to control a flow of a portion of the photo-generated electrons to the first n-doped region. The second carrier steerer includes a second p-doped region, a second n-doped region electrically shorted with the second p-doped region, a third gate coupled to the third control circuit, the third gate configured to control a flow of a portion of the photo-generated holes to the second p-doped region, and a fourth gate coupled to the fourth control circuit, the fourth gate configured to control a flow of a portion of the photo-generated electrons to the second n-doped region.

Implementations of the optical sensing apparatus can include one or more features of other aspects.

In general, in yet another implementation, the disclosure features an apparatus including one or more optical cameras and a pixel array for time-of-flight sensing. Each pixel includes an absorption region configured to receive an optical signal and to generate, based on the optical signal, photo-generated electrons and photo-generated holes. Each pixel also includes a first carrier steerer and a second carrier steerer. The first carrier steerer includes a first p-doped region and a first n-doped region electrically shorted with the first p-doped region, a first gate configured to control a flow of a portion of the photo-generated holes to the first p-doped region, and a second gate configured to control a flow of a portion of the photo-generated electrons to the first n-doped region. The second carrier steerer includes a second p-doped region, a second n-doped region electrically shorted with the second p-doped region, a third gate configured to control a flow of a portion of the photo-generated holes to the second p-doped region, and a fourth gate configured to control a flow of a portion of the photo-generated electrons to the second n-doped region. The apparatus can be a mobile device.

Implementations of the apparatus can include one or more features of other aspects.

In general, in another aspect, the disclosure features a method for sensing an object, including resetting an optical sensing apparatus that includes an absorption region configured to receive an optical signal and to generate, based on the optical signal, photo-generated electrons and photo-generated holes, a first carrier steerer and a second carrier steerer. The first carrier steerer includes a first p-doped region, a first n-doped region electrically shorted with the first p-doped region, a first gate configured to control a flow of a portion of the photo-generated holes to the first p-doped region, and a second gate configured to control a flow of a portion of the photo-generated electrons to the first n-doped region. The second carrier steerer includes a second p-doped region, a second n-doped region electrically shorted with the second p-doped region, a third gate configured to control a flow of a portion of the photo-generated holes to the second p-doped region, and a fourth gate configured to control a flow of a portion of the photo-generated electrons to the second n-doped region. The method includes receiving, by the first gate and from a first control circuit coupled to the first gate, a first oscillating voltage that oscillates from zero to a first positive value, and receiving, by the second gate and from a second control circuit coupled to the second gate, a second oscillating voltage that oscillates from a first negative value to zero. When the first oscillating voltage is at zero, the second oscillating voltage is at the first negative value. When the first oscillating voltage is at the first positive value, the second oscillating voltage is at zero. The method also includes receiving, by the third gate and from a third control circuit coupled to the third gate, a third oscillating voltage that oscillates from zero to the first positive value, wherein the third oscillating voltage is 180-degree out-of-phase from the first oscillating voltage, and receiving, by the fourth gate and from a fourth control circuit coupled to the fourth gate, a fourth oscillating voltage that oscillates from the first negative value to zero, wherein the fourth oscillating voltage is 180-degree out-of-phase from the second oscillating voltage. The method also includes providing, by the first carrier steerer and to a first readout circuit, a first photo-current generated by the absorption region, and providing, by the second carrier steerer and to a second readout circuit, a second photo-current generated by the absorption region, wherein the first photo-current and the second photo-current have opposite polarities.

Implementations of the method can include determining, based on a frequency of the oscillating voltages and a collection of the photo-currents, one or more characteristics of the object including depth information of the object or distance information representing a distance between the optical sensing apparatus and the object.

Implementations of the method can include one or more features of other aspects.

Various other features and advantages will be apparent from the description, the figures, and the claims.

BRIEF DESCRIPTIONS OF FIGURES

Among the drawings, like symbols indicate like elements.

DETAILED DESCRIPTION

An optical sensor, or a photodetector, may be used to detect optical signals and convert the optical signals to electrical signals that may be further processed by another circuitry.

Figure 1A:
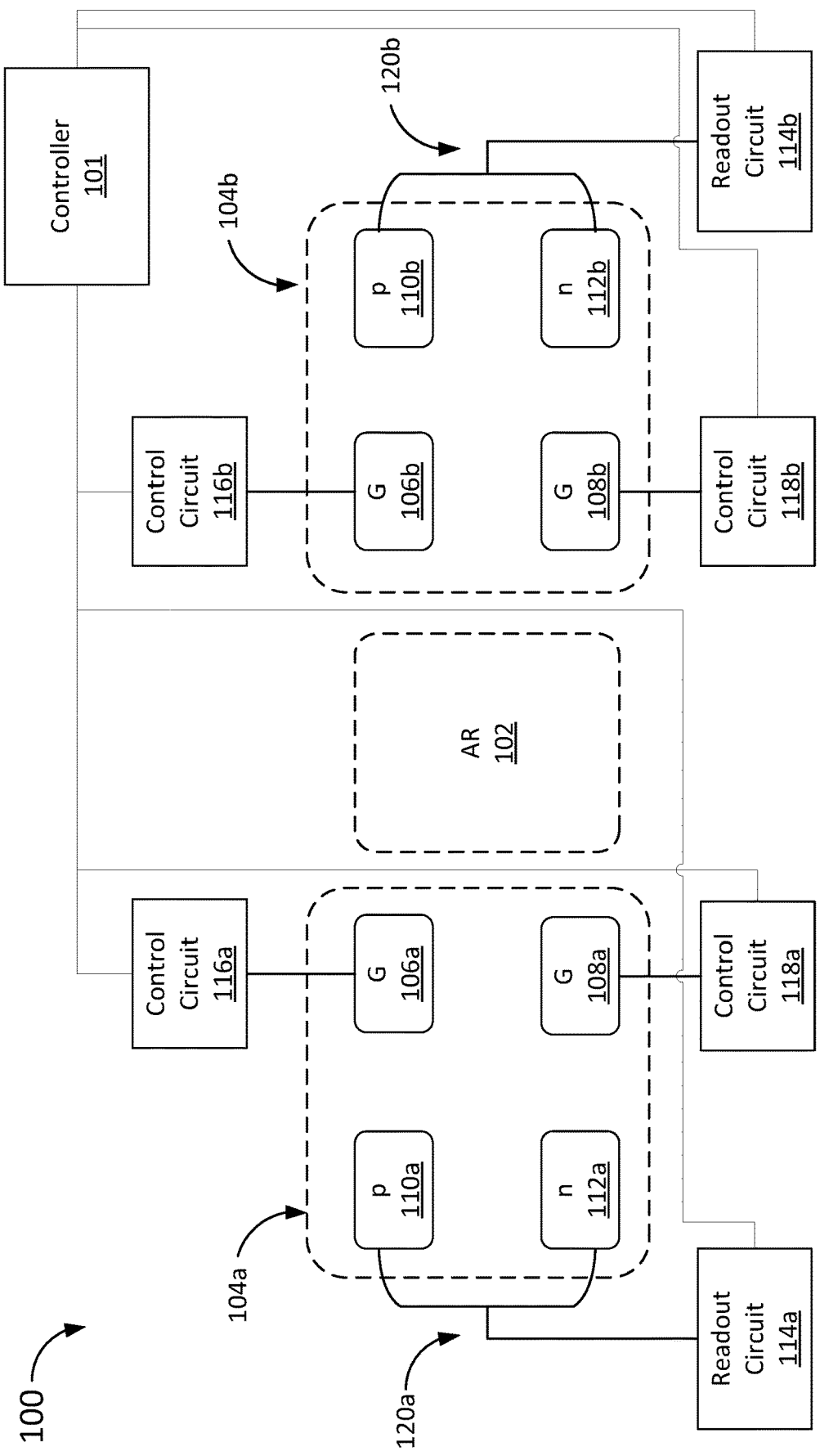
FIG. 1A is a schematic drawing of an example of an optical sensor.

FIG. 1A schematically illustrates an example of an optical sensor 100. The optical sensor 100 can be, for example, a single pixel in a pixel array (e.g., a one dimensional or two dimensional array). The optical sensor 100 includes an absorption region 102, a first carrier steerer 104a, and a second carrier steerer 104b. In this example, the first carrier steerer 104a includes a p-doped region 110a, an n-doped region 112a, a gate 106a that controls a flow of holes between the absorption region 102 and the p-doped region 110a, and a gate 108a that controls a flow of electrons between the absorption region 102 and the n-doped region 112a. The second carrier steerer 104b includes a p-doped region 110b, an n-doped region 112b, a gate 106b that controls a flow of holes between the absorption region 102 and the p-doped region 110b, and a gate 108b that controls a flow of electrons between the absorption region 102 and the n-doped region 112b.

The gate 106a, the gate 108a, the gate 106b, and the gate 108b are electrically coupled to a control circuit 116a, a control circuit 118a, a control circuit 116b, and a control circuit 118b, respectively. In general, the gates 106a, 108a, 106b, 108b can be implemented using any suitable gate structures that control carriers between two a carrier source and a carrier destination. For example, the gates 106a, 108a, 106b, 108b can be implemented by MOS/MIS junction, lightly-doped/undoped MS junction (Schottky contact), or heavily-doped MS junction (Ohmic contact). The control circuits 116a, 118a, 116b, and 118b can be implemented using any suitable circuitry that outputs desirable voltage levels to the gates 106a, 108a, 106b, 108b.

The p-doped region 110a is electrically shorted with the n-doped region 112a to form a node 120a. The node 120a can be electrically coupled to a readout circuit 114a. The p-doped region 110b is electrically shorted with the n-doped region 112b to form a node 120b. The node 120b can be electrically coupled to a readout circuit 114b. The readout circuits 114a and 114b can be implemented using any suitable circuitry that receives electron and/or hole currents from the first carrier steerer 104a and the second carrier steerer 104b, and provides electrical outputs that can be further detected and analyzed by other hardware and/or software.

The optical sensor 100 is in communication with a controller 101 (e.g., a computer motherboard including a data processor, memory, etc.), which controls and coordinates signals generate and/or received by control circuits 116a, 116b, 118a, and 118b, and the readout circuits 114a and 114b, coordinating operation of the optical sensor 100 and processing signals received therefrom. Circuitry, e.g., integrated on the same chip as the optical sensor, packaged with the optical sensor, and/or otherwise electrically connected between the optical sensor 100 and controller 101, couples the optical sensor 100 to the controller 101. In some implementations, wireless couplings can be used in addition, or alternative, to circuitry.

Figure 1B:
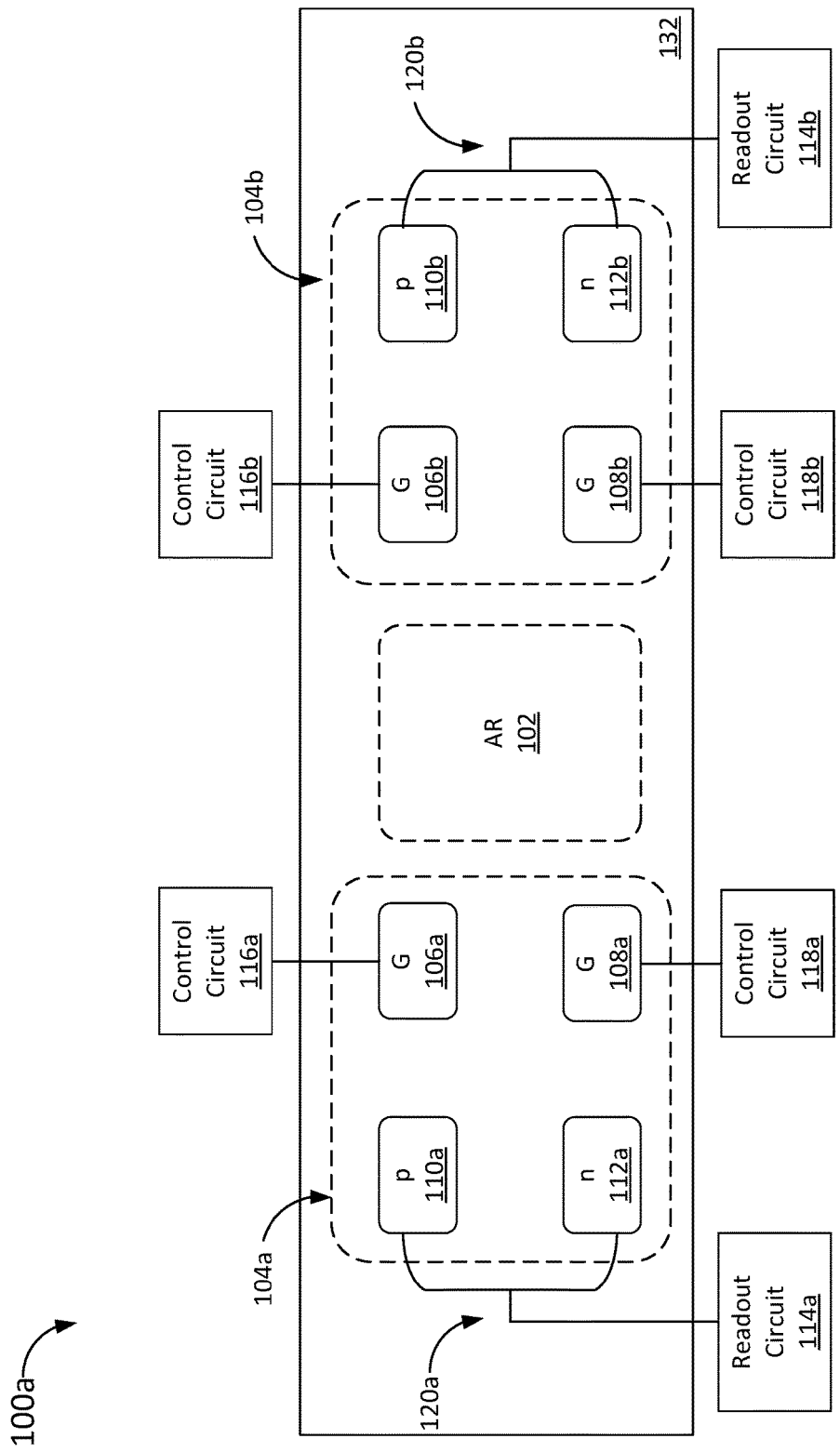
FIGS. 1B and 1C are a schematic plan and sectional view through an example embodiment of an optical sensor.
Figure 1C:
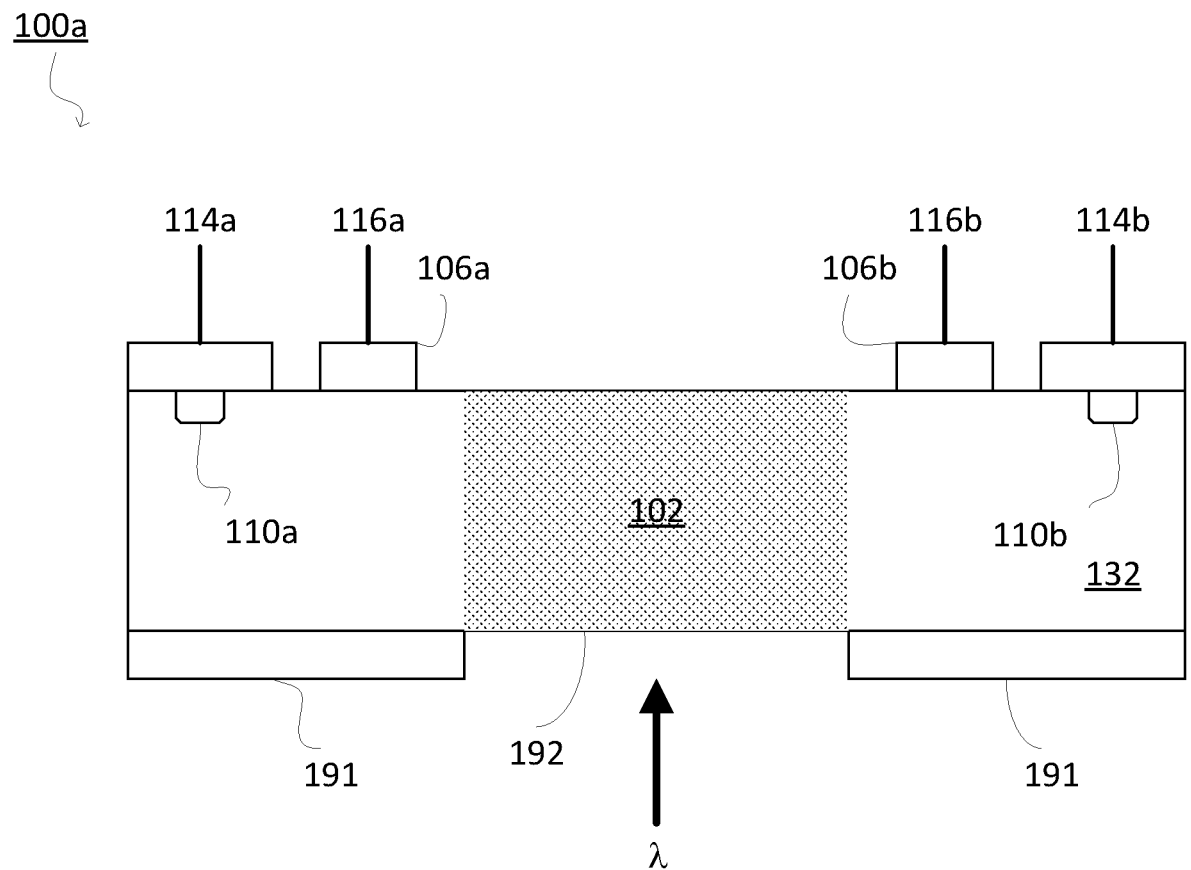

The general architecture of optical sensor 100 can be implemented in a variety of different designs. Referring to FIGS. 1B and 1C, an example design is optical sensor 100a. The optical sensor 100a is similar to the optical sensor 100 as described above, where the absorption region 102, the first carrier steerer 104a, and the second carrier steerer 104b are formed using a single semiconductor material 132. The material 132 can be silicon, silicon-germanium, germanium, germanium-tin, or any other suitable material such as a III-V material. Generally, the material is selected based on its sensitivity to one or more wavelengths of operation for the optical sensor. These can include, for example, wavelengths in the ultraviolet, visible, and/or infrared portions of the electromagnetic spectrum.

In general, some or all of the control circuits 116a, 118a, 116b, and 118b, the readout circuits 114a and 114b, and other circuitry can be formed using the same substrate containing material 132. Alternatively, some or all of the control circuits 116a, 118a, 116b, and 118b, the readout circuits 114a and 114b, and other circuitry can be formed using a different substrate containing material 132 (not shown) and then electrically coupled (e.g., wire-bonded or flip-chip bonded or die/wafer bonded) to the optical sensor.

As shown in FIG. 1C, optical sensor 100a includes a layer of a masking material 191 on one side of the sensor that defines an aperture 192 through which light can pass into absorption region 102. Doped regions 110a/b are formed on the opposite side of material 132 from aperture 192. Note that only doped regions 110a and 110b are shown in FIG. 1C because doped regions 112a/b are laterally offset at different locations and not intersected by the cross-section shown in the figure.

Operation of optical sensor 100a will now be described in the context of an application, although, in general, the optical sensors described herein can be applied in a variety of applications. For example, the optical sensor can be incorporated into sensor arrays that may be used in consumer electronics products, image sensors, data communications, medical devices and other suitable applications for sensor arrays. These can include use as proximity sensors, image sensors, and/or direct or indirect time-of-flight (TOF) ranging sensors.

Figure 2:
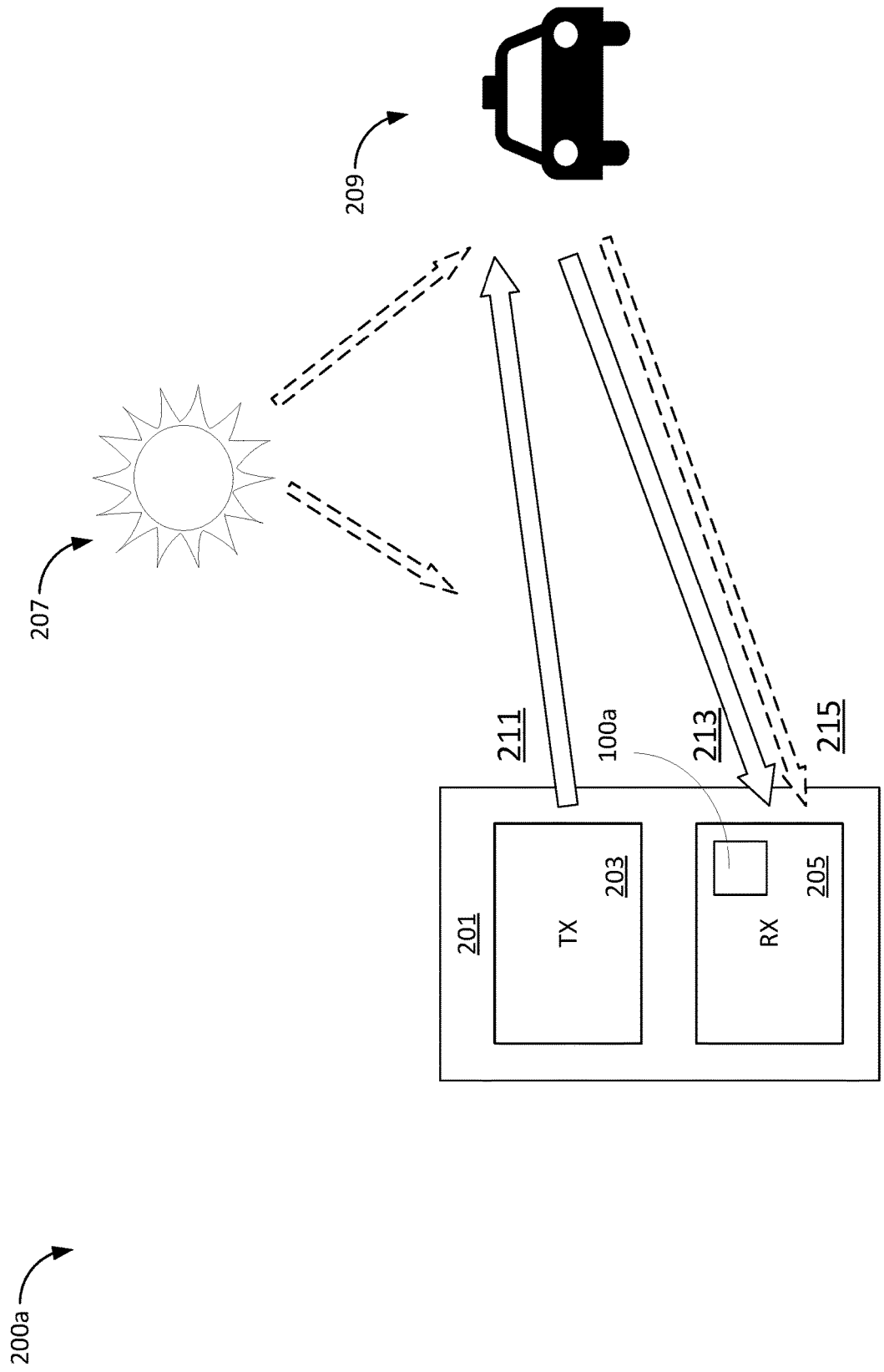
FIG. 2 is a schematic drawing showing an example of a system having an array of lock-in pixels for sensing an object in an environment, each lock-in pixel being based on an optical sensor.

For example, FIG. 2 illustrates an example of a system 200a having a lock-in pixel 100a for sensing an object in an environment. The system 200a includes a device 201, an object 209, and an ambient light source 207. The device 201 may be a mobile device (e.g., a smartphone, a tablet, etc.), a vehicle, and/or any other suitable devices that are implemented to have functions for sensing objects. The device 201 includes a transmitter 203 and a receiver 205. The transmitter 203 is configured to transmit an optical signal 211 that propagates towards object 209. In some implementations, the optical signal 211 is a periodic signal (e.g., a sine wave, a square wave, or a pulsed signal, etc.) having one or more operating frequencies. The optical signal 211 reflects from a surface of the object 209, and the reflected optical signal 213 is received by the receiver 205. In many applications, an ambient light source 207 (e.g., outdoor ambient sunlight) is present in the environment during the sensing of the object 209. Often, ambient light will also reflect from the surface of the object 209, and a reflected ambient optical signal 215 may be received by the receiver 205. Alternatively, or additionally, the ambient light can be directly incident on the receiver 205 during operation. In either case, when incident on receiver 205, ambient light can be a source of noise in signals from the pixels of the receiver.

Turning now to sensor operation, which is explained with reference to FIGS. 3A-3E, FIG. 3A illustrates an example 200b of power transmitted and received by the system 200a during operation. Here, the optical signal 211 is a square wave periodic signal having an average power of $P_{Tx}$ and a period of T with a 50% duty cycle. Upon reflecting from the surface of the object 209, the receiver 205 receives the reflected optical signal 213 having an average power of $P_{RX}$ and a time delay of T_Delay. Generally, the time delay is related to the distance traveled by the light from the transmitter 203 to the object 209 and from the object 209 to the receiver 205. The time delay T_Delay can be used to derive a phase difference between the optical signal 211 and the reflected optical signal 213, where the phase difference can be used to derive one or more characteristics (e.g., distance between the device 201 and the object 209) of the object 209. The reflected ambient optical signal 215 has a constant power of $P_{amb}$, and the total power received by the receiver 205 has an average power of $P_{RX+amb}$, a time delay of T_Delay, and a period of T.

Figure 3A:
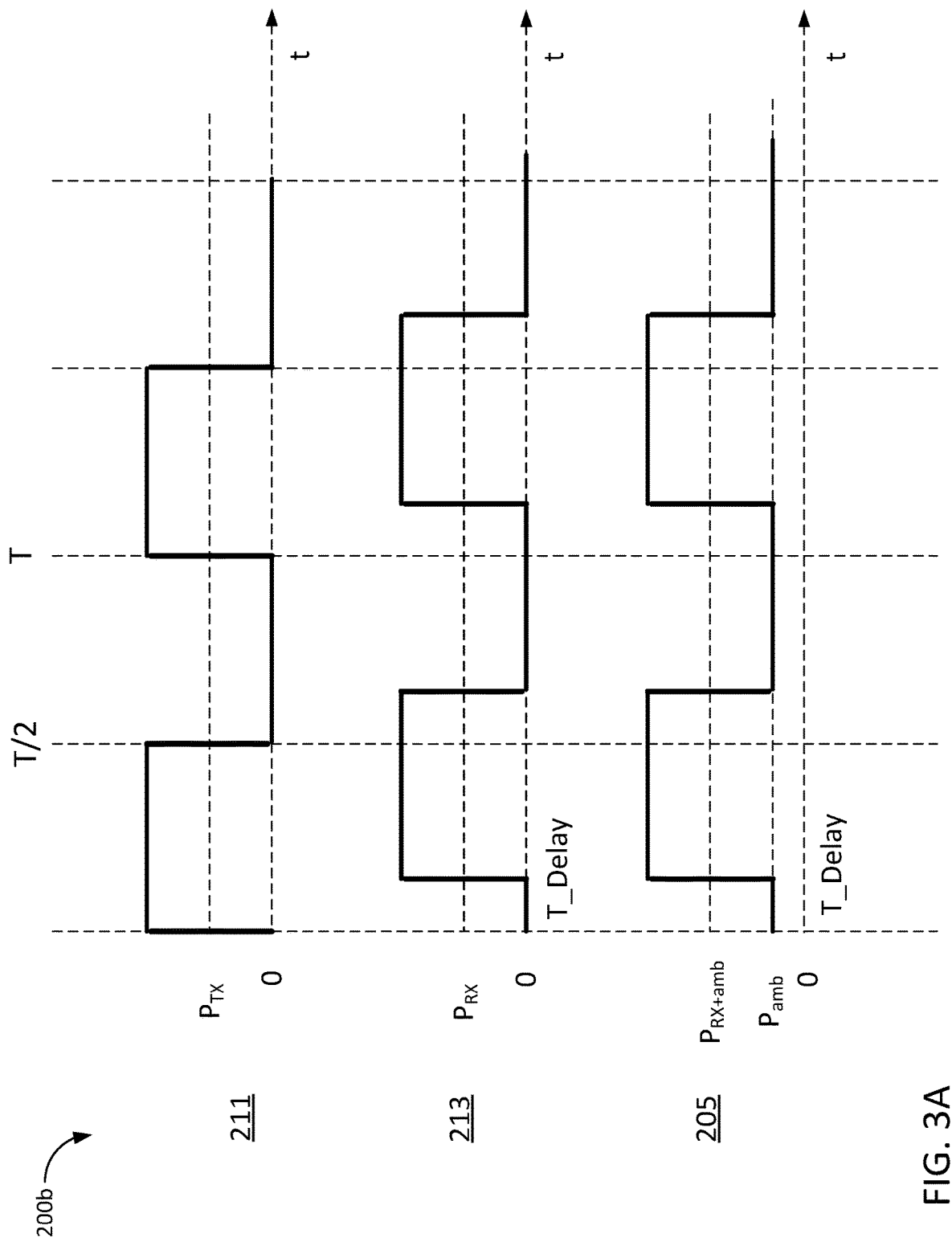
FIG. 3A are time plots showing an example of power transmitted and received by a system having an array of lock-in pixels.
Figure 3B:
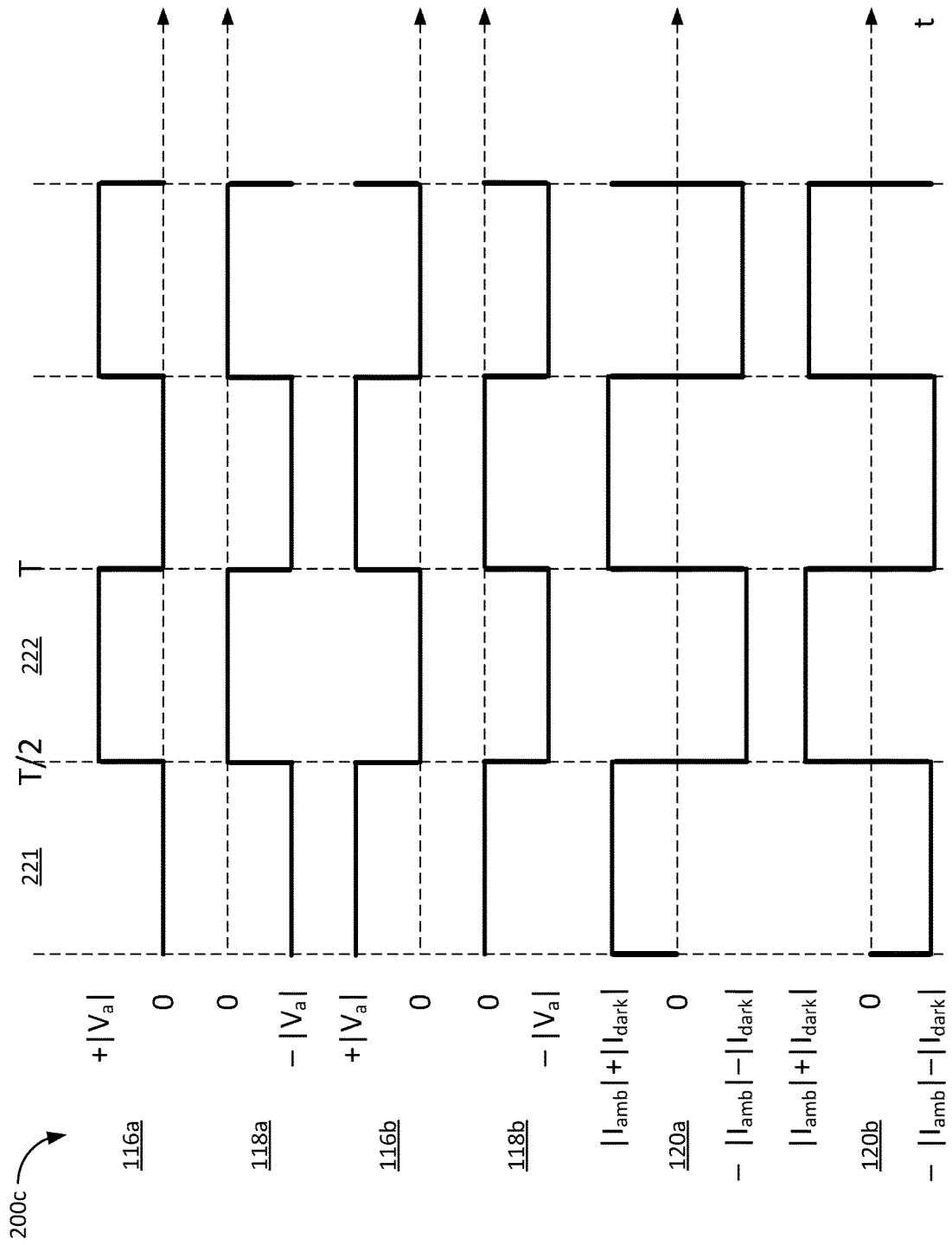
FIGS. 3B and 3C are time plots showing examples of electrical current received by a system having an array of lock-in pixels.

Referring also to FIG. 3B for purposes of this example, the system's controller (e.g., controller 101) synchronizes operation of optical sensor 100a with the transmitter 203 as follows. The control circuit 116a provides a periodic voltage having a period of T and a positive peak voltage of $+|V_a|$ to the gate 106a. The control circuit 118a provides a periodic voltage having a period of T and a negative peak voltage of $-|V_a|$ to the gate 108a. The control circuit 116b provides a periodic voltage having a period of T and a positive peak voltage of $+|V_a|$ to the gate 106b, where the periodic voltage provided by the control circuit 116b is 180-degree out-of-phase from the periodic voltage provided by the control circuit 116a. The control circuit 118b provides a periodic voltage having a period of T and a negative peak voltage of $-|V_a|$ to the gate 108b, where the periodic voltage provided by the control circuit 118b is 180-degree out-of-phase from the periodic voltage provided by the control circuit 118a. The duty cycles of these signals are all 50%, like the duty cycle of the transmitter's signal shown in FIG. 3A.

Each photon absorbed in absorption region 102, including photons from the optical signal and from ambient light, generates an electron-hole pair in the absorption region which contribute to electrical signals generated by optical sensor 100a. The absorption region 102 may also generate additional electron-hole pairs through dark current.

Figure 3C:
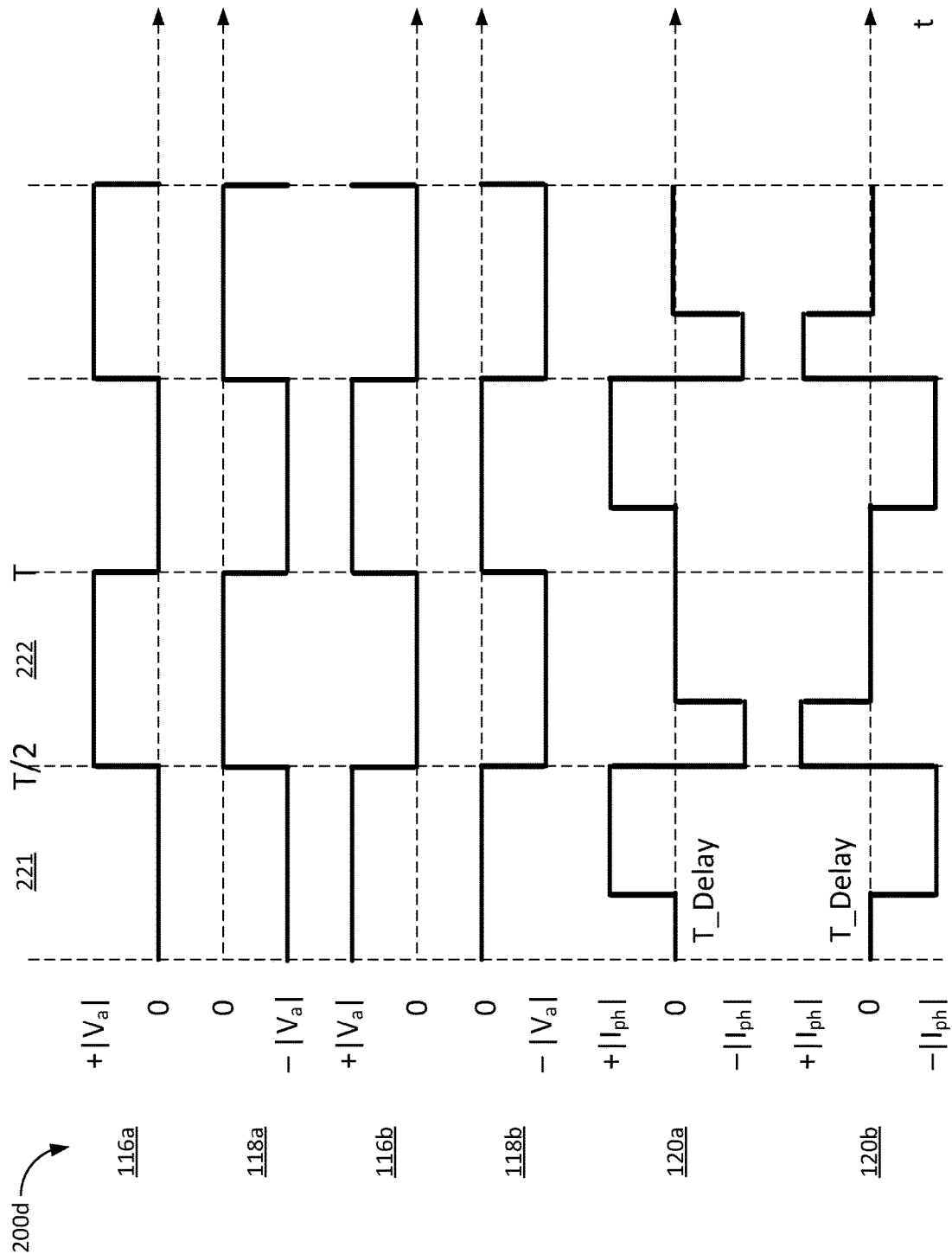
Figure 3D:
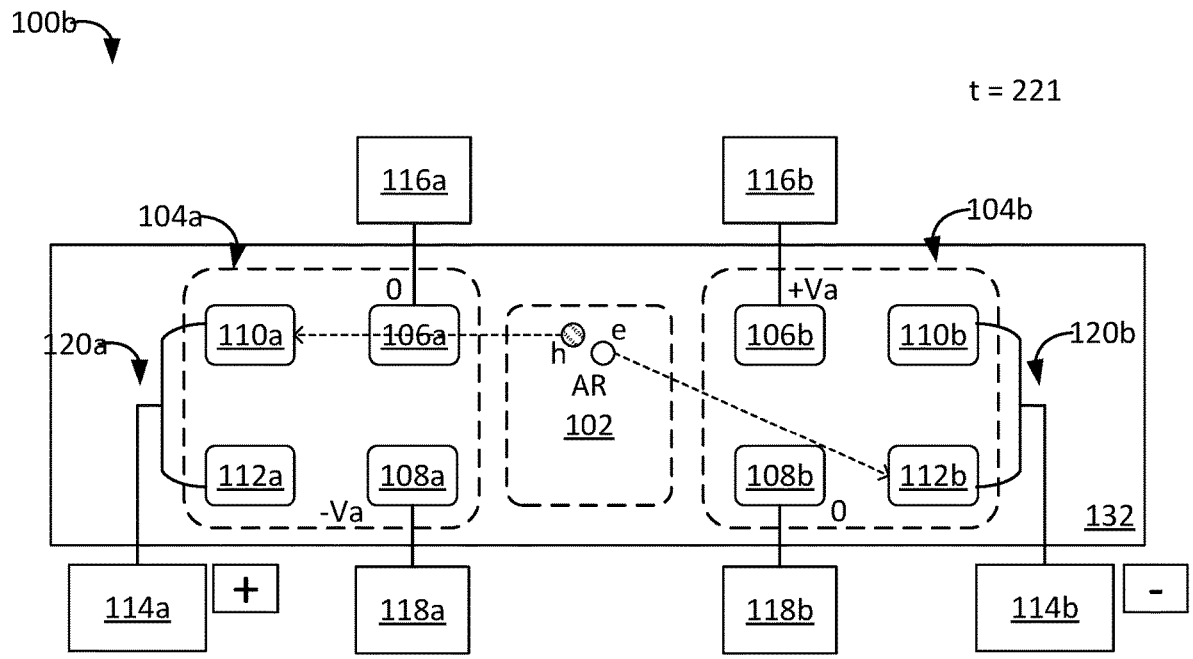
FIGS. 3D and 3E are schematic plan views of the example embodiment of the optical sensor shown in FIGS. 1B and 1C, illustrating operation of the optical sensor at different times.

Referring also to FIG. 3D, during time period 221 (i.e., t=0 to t=T/2), holes generated by the dark current and the ambient light in the absorption region 102 are steered towards the p-region 110a through the gate 106a and are not steered towards the p-region 110b through the gate 106b due to the higher voltage (i.e., +|Va|) applied by the control circuit 116b than the voltage (i.e., 0) applied by the control circuit 116a. On the other hand, electrons generated by the dark current and the ambient light in the absorption region 102 are steered towards the n-region 112b through the gate 108b and are not steered towards the n-region 112a through the gate 108a due to the lower voltage (i.e., −|Va|) applied by the control circuit 118a than the voltage (i.e., 0) applied by the control circuit 118b. As such, during time period 221, the node 120a generates a positive hole current while the node 120b generates a negative electron current.

Figure 3E:
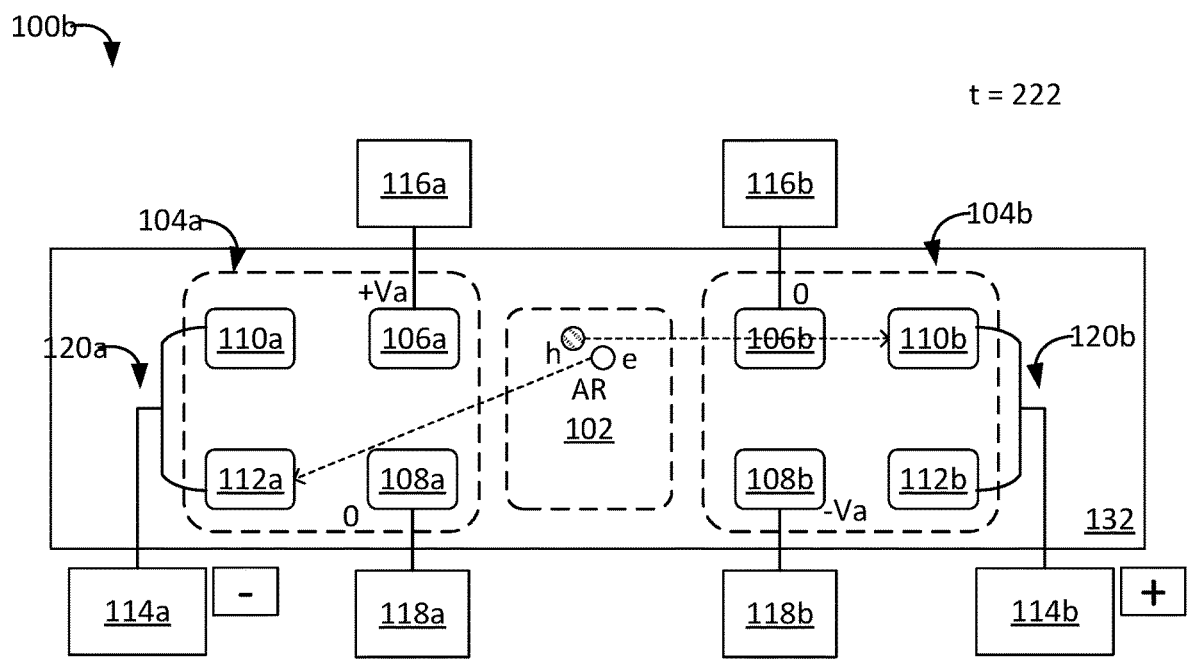

Referring specifically to FIGS. 3B and 3E, during time period 222 (i.e., t=T/2 to t=T), holes generated by the dark current and the ambient light in the absorption region 102 are steered towards the p-region 110b through the gate 106b but are not steered towards the p-region 110a through the gate 106a due to the higher voltage (i.e., +|Va|) applied by the control circuit 116a than the voltage (i.e., 0) applied by the control circuit 116b. On the other hand, electrons generated by the dark current and the ambient light in the absorption region 102 are steered towards the n-region 112a through the gate 108a but are not steered towards the n-region 112b through the gate 108b due to the lower voltage (i.e., −|Va|) applied by the control circuit 118b than the voltage (i.e., 0) applied by the control circuit 118a. As such, during time period 222, the node 120a generates a negative electron current while the node 120b generates a positive hole current.

Importantly, although the photo-current generated by dark current and ambient light is constant (i.e., DC), over each cycle (i.e., each period T), the average current generated by each of the node 120a and the node 120b due to dark current and ambient light is zero in this scenario. Accordingly, a lock-in pixel with a zero-mean noise current (e.g., dark current plus ambient current) may be achieved using the optical sensor 100a. With a zero-mean lock-in pixel, noise-current charge accumulation in readout circuits (e.g., readout circuits 114a and 114b) may be reduced or eliminated, which reduces or eliminates the need to reset these readout circuits, and in turn reduces the overall power consumption. Also, since the electron-hole pairs generated in the depletion region of a p-n junction may mostly recombine through the shorted connection, the variance of the noise current may be low.

FIG. 3C illustrates an example 200d of electrical currents generated by the first carrier steerer 104a and the second carrier steerer 104b of the optical sensor 100a in the system 200a when accounting for detection of the optical signal 213 in addition to the current from ambient light and dark current. As noted previously and shown also in FIG. 3B, during operation of the optical sensor 100a, the control circuit 116a provides a periodic voltage having a period of T and a positive peak voltage of $+|V_a|$ to the gate 106a. The control circuit 118a provides a periodic voltage having a period of T and a negative peak voltage of $-|V_a|$ to the gate 108a. The control circuit 116b provides a periodic voltage having a period of T and a positive peak voltage of $+|V_a|$ to the gate 106b, where the periodic voltage provided by the control circuit 116b is 180-degree out-of-phase from the periodic voltage provided by the control circuit 116a. The control circuit 118b provides a periodic voltage having a period of T and a negative peak voltage of $-|V_a|$ to the gate 108b, where the periodic voltage provided by the control circuit 118b is 180-degree out-of-phase from the periodic voltage provided by the control circuit 118a.

When reflected optical signal (e.g., the reflected optical signal 213) is received by the absorption region 102, electron-hole pairs are generated in the absorption region 102. Moreover, as explained above, the reflected optical signal 213 has a phase shift from the optical signal 211, which can be derived by the time delay T_Delay. Thus, from t=0 to t=T_Delay during time period 221, no current is generated in the nodes 120a and 120b because the optical sensor 100a has yet received the reflected optical signal 213. From t=T_Delay to t=T/2 during time period 221, holes generated by the reflected optical signal 213 in the absorption region 102 are steered towards the p-region 110a through the gate 106a but are not steered towards the p-region 110b through the gate 106b due to the higher voltage (i.e., +|V_a|) applied by the control circuit 116b than the voltage (i.e., 0) applied by the control circuit 116a. On the other hand, electrons generated by the reflected optical signal 213 in the absorption region 102 are steered towards the n-region 112b through the gate 108b but are not steered towards the n-region 112a through the gate 108a due to the lower voltage (i.e., −|V_a|) applied by the control circuit 118a than the voltage (i.e., 0) applied by the control circuit 118b. As such, when the optical sensor 100a receives the reflected optical signal 213 during time period 221, the node 120a generates a positive hole current while the node 120b generates a negative electron current.

From t=T/2 to t=(T/2+T_Delay) during time period 222, holes generated by the reflected optical signal 213 in the absorption region 102 are steered towards the p-region 110b through the gate 106b but are not steered towards the p-region 110a through the gate 106a due to the higher voltage (i.e., +|V_a|) applied by the control circuit 116a than the voltage (i.e., 0) applied by the control circuit 116b. On the other hand, electrons generated by the reflected optical signal 213 in the absorption region 102 are steered towards the n-region 112a through the gate 108a but are not steered towards the n-region 112b through the gate 108b due to the lower voltage (i.e., −|V_a|) applied by the control circuit 118b than the voltage (i.e., 0) applied by the control circuit 118a. As such, when the optical sensor 100a receives the reflected optical signal 213 during time period 222, the node 120a generates a negative electron current while the node 120a generates a positive hole current.

From t=(T/2+T_Delay) to t=T during time period 222, no current is generated in the nodes 120a and 120b because the optical power of the optical signal 211 transmitted by the transmitter is zero from t=T/2 to t=T, as illustrated in FIG. 2B. The collection of charges in the readout circuits over time may be analyzed to determine one or more characteristics (e.g., distance between two objects) of the environment. For example, during a duration τ1 equal to or larger than T, the difference between the collection of charges in the readout circuits 114a and 114b over time is processed as an in-phase signal; and, during another duration τ2 equal to or larger than T, in which the phases of the voltages provided by the control circuits 116a, 118a, 116b, and 118b are shifted by 90 degree, the difference between the collection of charges in the readout circuits 114a and 114b over time is processed as a quadrature signal. T_Delay can then be calculated from the in-phase and the quadrature signals.

As already noted, the operation scheme and application described above is just an example of how the optical sensors disclosed herein can operation. In general, the periodic electric signals, their pulse shapes, relative voltages, duty cycles, etc. can be varied as appropriate from the specific example described based on the specific sensor design and application. For example, the frequency of the periodic signal and/or wavelength of operation can be selected based on the end use application.

Figure 4:
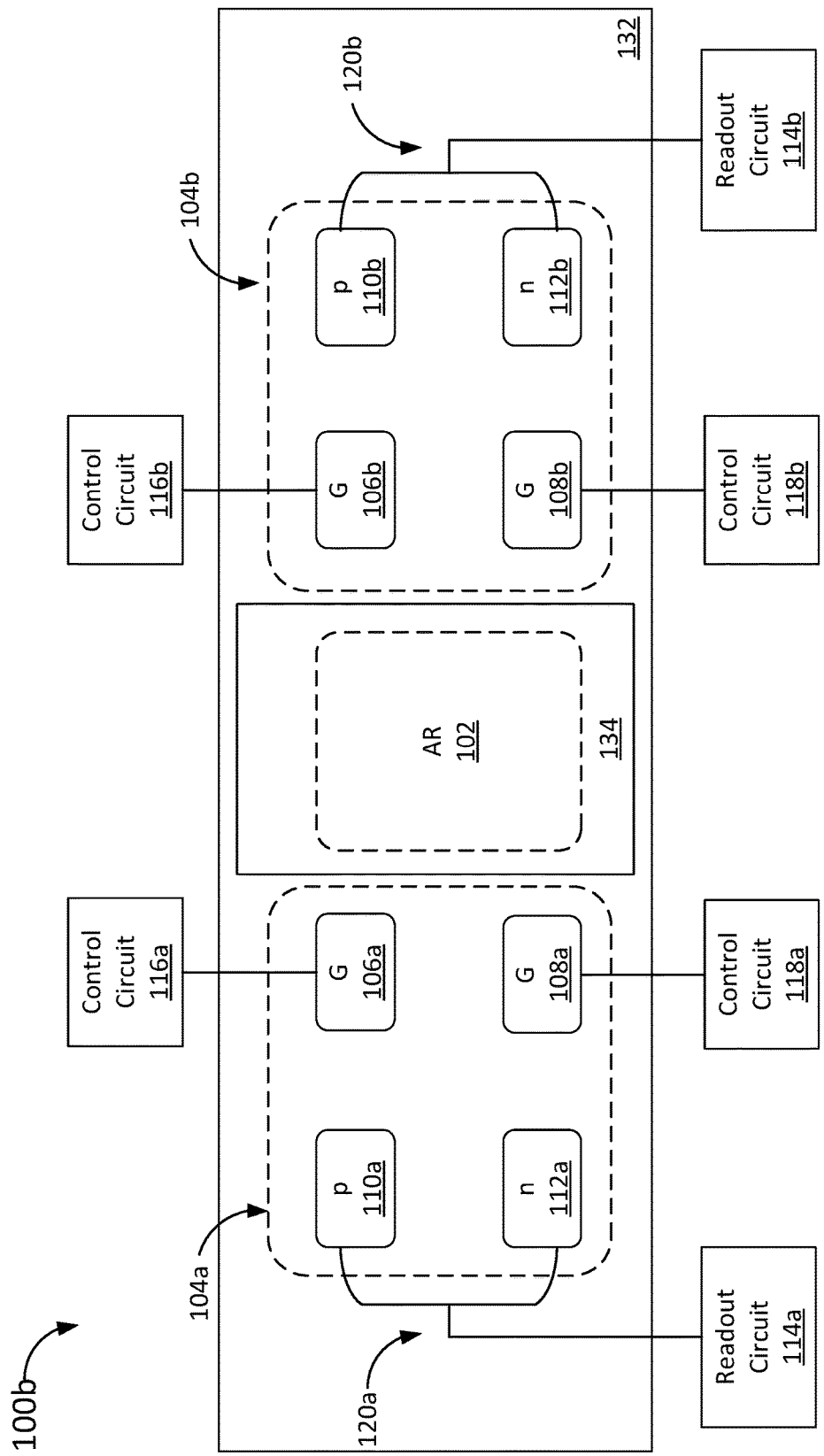
FIG. 4 is a schematic plan view of another example of an optical sensor.

Turning again to the sensor architecture, while optical sensor 100a is formed using a single semiconductor material for the absorption regions and carrier steerers, other implementations are possible. For example, FIG. 4 illustrates an example of an optical sensor 100b. The optical sensor 100b is similar to the optical sensor 100a as described above, where the absorption region 102 is formed using a first material 134 (e.g., a first semiconductor material), and the first carrier steerer 104a and the second carrier steerer 104b are formed using a different second material 132 (e.g., a second semiconductor material). Each of the first material 134 and the second material 132 can be silicon, silicon-germanium, germanium, germanium-tin, or any other suitable materials such as a III-V material.

Figure 5:
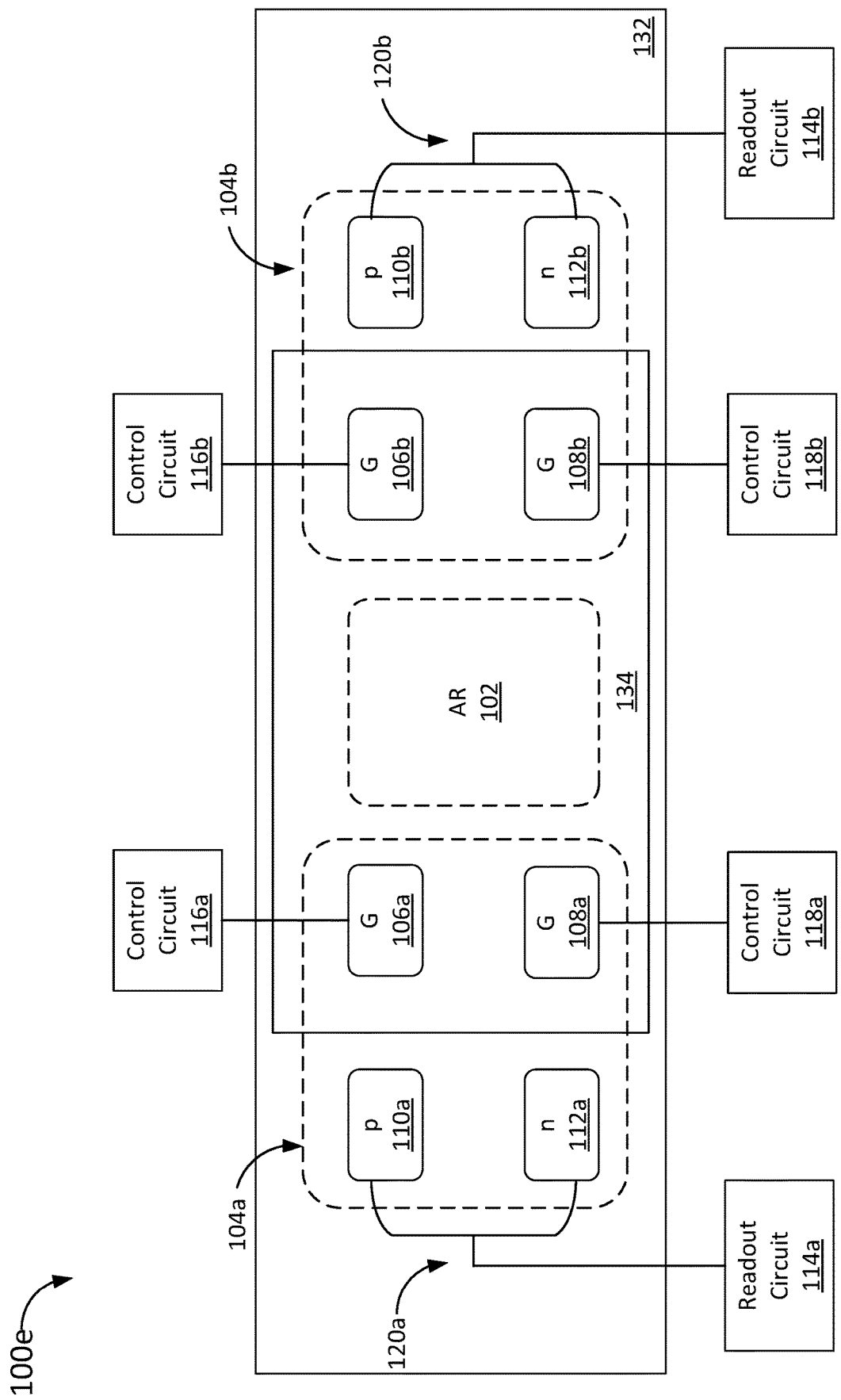
FIG. 5 is a schematic plan view of yet another example of an optical sensor.

FIG. 5 illustrates a further example of an optical sensor 100c. The optical sensor 100c is similar to the optical sensor 100a as described above, where the absorption region 102 and a portion (e.g., the gates) of the first carrier steerer 104a and the second carrier steerer 104b are formed using a first material 134 (e.g., a first semiconductor material). The other portion of the first carrier steerer 104a and the second carrier steerer 104b are formed using a different second material 132 (e.g., a second semiconductor material). Each of the first material 134 and the second material 132 can be silicon, silicon-germanium, germanium, germanium-tin, or any other suitable materials such as a III-V material.

Figure 6:
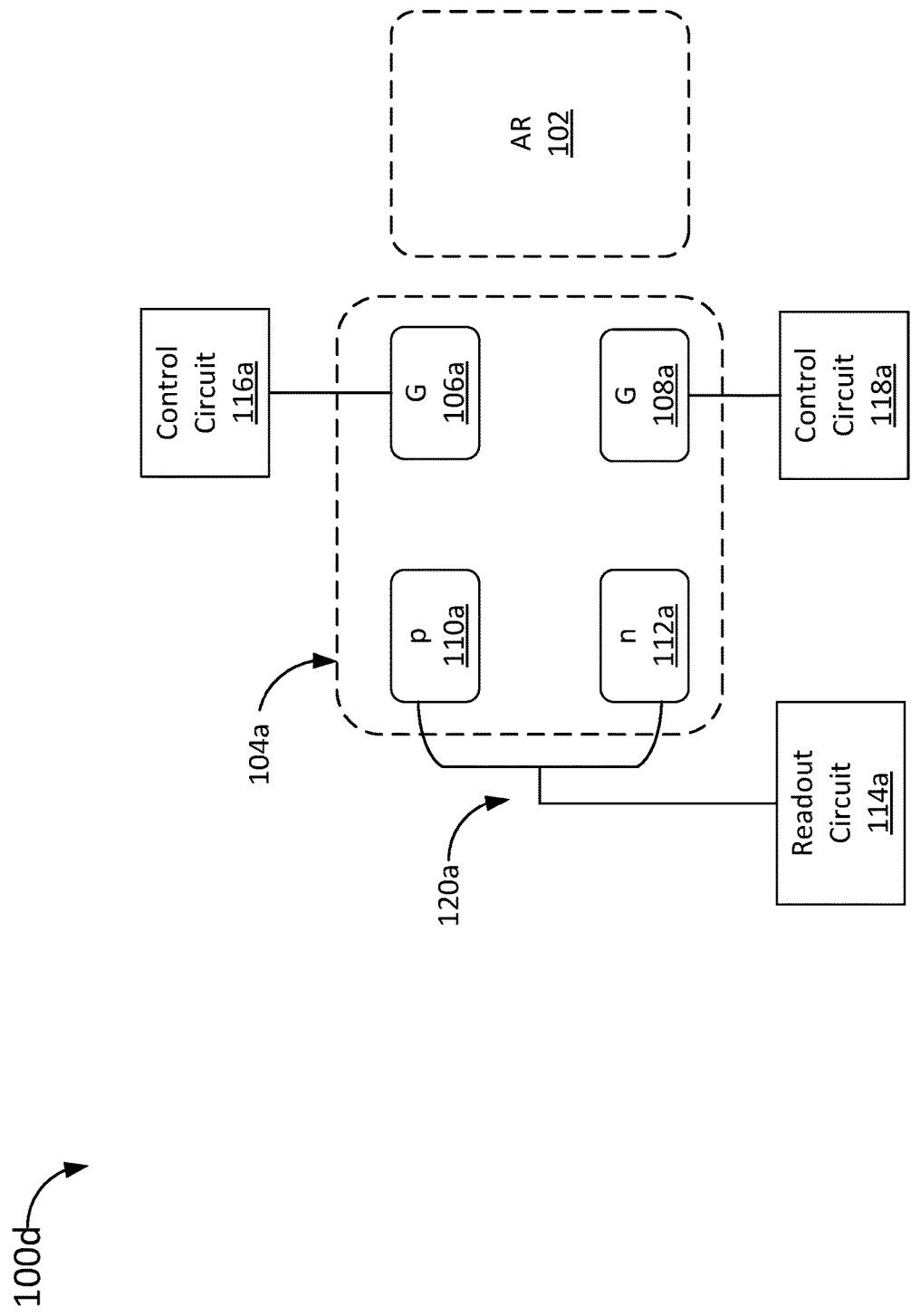
FIG. 6 is a schematic drawing of still another example of an optical sensor.

Other implementations are possible. For instance, the above implementations are based on a two-tap operation, i.e., two carrier steerers 104a and 104b are utilized in a lock-in pixel. In some implementations, a one-tap operation is possible by utilizing only one carrier steerer, e.g., 104a, in a lock-in pixel as illustrated in FIG. 6 showing an optical sensor 100d. For example, the difference between the collection of charges in the readout circuits 114a in a duration τ1 (with 0 degree shift of the phases of the voltages provided by the control circuits 116a, 118a) and in a duration τ2 (with 180 degree shift of the phases of the voltages provided by the control circuits 116a, 118a) is processed as an in-phase signal; and, the difference between the collection of charges in the readout circuits 114a in a duration τ3 (with 90 degree shift of the phases of the voltages provided by the control circuits 116a, 118a) and in a duration τ4 (with 270 degree shift of the phases of the voltages provided by the control circuits 116a, 118a) is processed as a quadrature signal. T_Delay can then be calculated from the in-phase and the quadrature signals.

The optical sensors can be fabricated using conventional semiconductor fabrication techniques.

Figure 7:
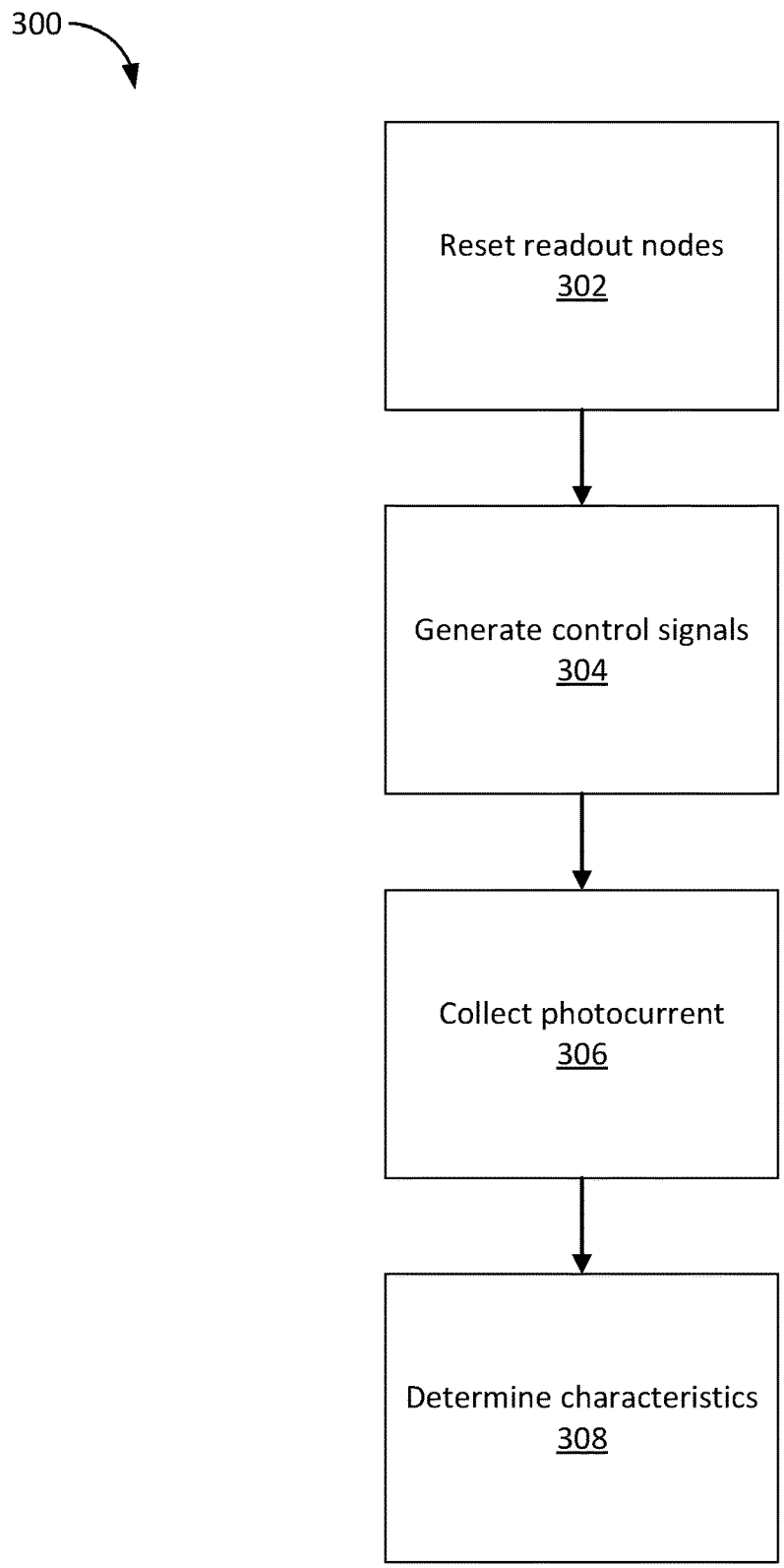
FIG. 7 is an example flow chart for operating an array of lock-in pixels.

In general, the operation of the optical sensors described herein can vary as appropriate to obtain signals having reduced noise. FIG. 7 shows a flow chart with steps in an example method 300 for operating an array of lock-in pixels, such as pixels implementing the architectures described above, e.g., optical sensors 100, 100a-d.

The system resets the readout nodes (302). For example, circuitry may issue a reset signal to reset charges stored in readout circuits 114a and 114b. The system generates control signals (304). For example, during operation of the optical sensor 100a, the control circuit 116a provides a periodic voltage having a period of T and a positive peak voltage of +|V_a| to the gate 106a. The control circuit 118a provides a periodic voltage having a period of T and a negative peak voltage of −|V_a| to the gate 108a. The control circuit 116b provides a periodic voltage having a period of T and a positive peak voltage of +|V_a| to the gate 106b, where the periodic voltage provided by the control circuit 116b is 180-degree out-of-phase from the periodic voltage provided by the control circuit 116a. The control circuit 118b provides a periodic voltage having a period of T and a negative peak voltage of −|V_a| to the gate 108b, where the periodic voltage provided by the control circuit 118b is 180-degree out-of-phase from the periodic voltage provided by the control circuit 118a.

The system collects photocurrent (306). For example, the absorption region 102 may generate electron-hole pairs based on absorbed light (e.g., a reflected optical signal). The photocurrent may be steered by carrier steerers and collected by readout circuits according to the descriptions related to FIGS. 2A-2D.

The system determines characteristics (308). For example, external circuitry may be used to read the charges stored by the readout circuits, and one or more characteristics (e.g., in-phase/quadrature signals, depth information, distance between two objects, reflectance, etc.) may be determined based on the readout circuit outputs.

Figure 8:
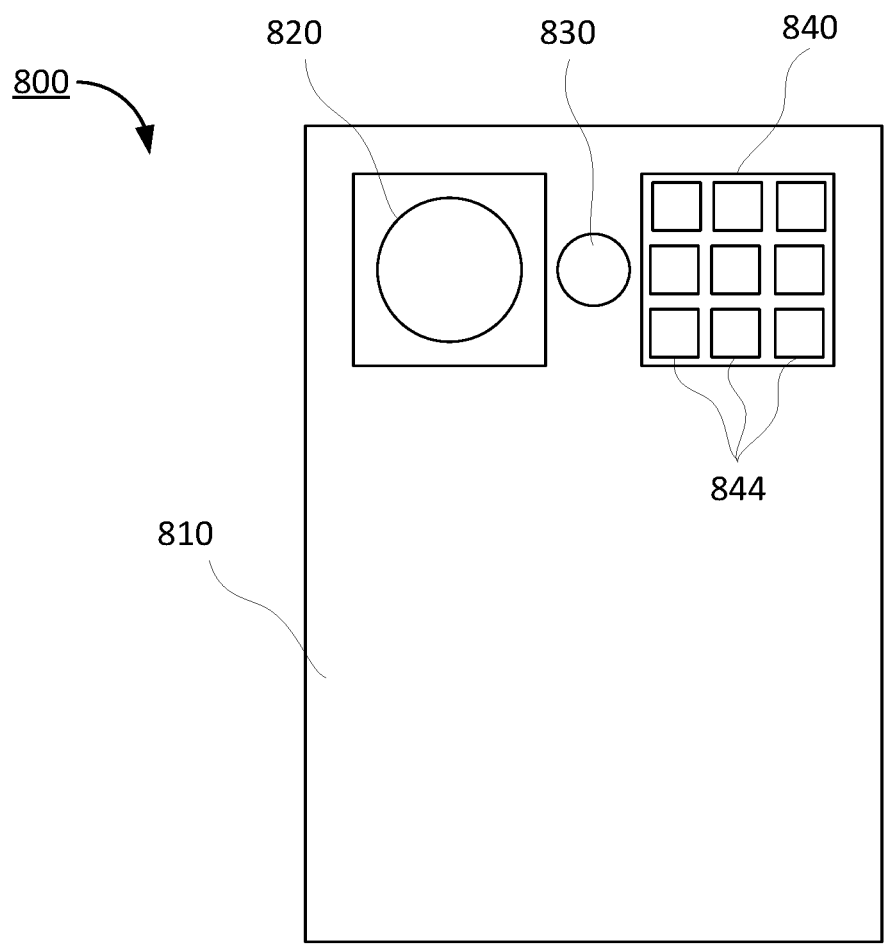
FIG. 8 is a schematic diagram of an example mobile device that includes an optical sensor.

In some embodiments, multiple optical sensors are incorporated into a mobile device (e.g., a mobile phone or tablet computer) to provide a sensor array in addition to one or more other sensors in the mobile device. For example, referring to FIG. 8, a mobile device 800 includes a camera sensor 820 and a pixelated optical sensing array 840 in which each pixel is composed of an optical sensor 844. Mobile device 800 also includes an emitter 830 that faces the same direction as optical sensing array 840 and emits light at a wavelength suitable for detection by optical sensing array 840, such as visible or infrared light. The camera sensor 820, optical sensing array 840, and emitter are 830 are housed in a chassis 810, along with other components (e.g., a display and touch panel, processor(s), modem(s), memory, etc.). The mobile device 800 can use the emitter 830 and optical sensing array 840 to perform three dimensional imaging of objects by a user.

Optical sensing apparatus described herein can also be incorporated into wearable devices, such as headsets, and used, e.g., for augmented reality and/or virtual reality applications.

A number of implementations have been described. Nevertheless, it will be understood that various modifications may be made without departing from the spirit and scope of the disclosure. For example, various forms of the flows shown above may be used, with steps re-ordered, added, or removed.

Various implementations may have been discussed using two-dimensional cross-sections and schematic depictions for easy description and illustration purpose. Nevertheless, the three-dimensional variations and derivations should also be included within the scope of the disclosure as long as there are corresponding two-dimensional cross-sections in the three-dimensional structures.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments have been described. Other embodiments are within the scope of the following claims. For example, the actions recited in the claims may be performed in a different order and still achieve desirable results.

What is claimed is:

1. An optical sensing apparatus comprising:
    an absorption region configured to receive an optical signal and to generate, in response to the optical signal, photo-generated electrons and photo-generated holes;
    a carrier steerer comprising:
        a first p-doped region;
        a first n-doped region electrically shorted with the first p-doped region;
        a first gate configured to control a flow of holes from the absorption region to the first p-doped region; and
        a second gate configured to control a flow of electrons from the absorption region to the first n-doped region; and
    circuitry electrically coupled to the carrier steerer and a controller, the circuitry configured receive electrical signals from the controller to synchronize operation of the first and second gates so that during a first time period holes flow from the absorption region to the first p-doped region while electrons do not flow from the absorption region to the first n-doped region and during a second time period electrons flow from the absorption region to the first n-doped region while holes do not flow from the absorption region to the first p-doped region.

2. The optical sensing apparatus of claim 1, wherein the carrier steerer is a first carrier steerer and the optical sensing apparatus further comprises a second carrier steerer comprising:
    a second p-doped region;
    a second n-doped region electrically shorted with the second p-doped region;
    a third gate configured to control a flow of holes from the absorption region to the second p-doped region; and
    a fourth gate configured to control a flow of electrons from the absorption region to the second n-doped region.

3. The optical sensing apparatus of claim 2, wherein the circuitry is electrically coupled to the second carrier steerer, the circuitry configured receive electrical signals from the controller to synchronize operation of the third and fourth gates so that during the second time period holes flow from the absorption region to the second p-doped region while electrons do not flow from the absorption region to the second n-doped region and during the first time period electrons flow from the absorption region to the second n-doped region while holes do not flow from the absorption region to second the p-doped region.

4. The optical sensing apparatus of claim 3,
    wherein the circuitry comprises a first control circuit, a second control circuit, a third control circuit, and a fourth control circuit,
    wherein the first gate, the second gate, the third gate, and the fourth gate are electrically coupled to the controller respectively via an output of the first control circuit, an output of the second control circuit, an output of the third control circuit, and an output of the fourth control circuit, and
    wherein the output of the first control circuit generates a voltage that ranges from zero to a first positive value, the output of the second control circuit generates a voltage that ranges from a first negative value to zero, the output of the third control circuit generates a voltage that ranges from zero to the first positive value, and the output of the fourth control circuit generates a voltage that ranges from the first negative value to zero.

5. The optical sensing apparatus of claim 4, wherein the circuitry is configured to receive electrical signals from the controller so that, during the first time period, the output of the first control circuit generates a voltage at zero and the output of the second control circuit generates a voltage at the first negative value, and the output of the third control circuit generates a voltage at the first positive value and the output of the fourth control circuit generates a voltage at zero.

6. The optical sensing apparatus of claim 5, wherein the circuitry is configured to receive electrical signals from the controller so that, during the second time period, the output of the first control circuit generates a voltage at the first positive value and the output of the second control circuit generates a voltage at the zero, and the output of the third control circuit generates a voltage at zero and the output of the fourth control circuit generates a voltage at the first negative value.

7. The optical sensing apparatus of claim 2, wherein the first carrier steerer is coupled to a first readout circuit and the second carrier steerer is coupled to a second readout circuit,
 the first carrier steerer being configured to provide a first photo-current to the first readout circuit and the second carrier steerer being configured to provide a second photo-current to the second readout circuit, and
 wherein a polarity of the first photo-current is opposite of a polarity of the second photo-current.

8. The optical sensing apparatus of claim 1, wherein the absorption region is composed of a first material.

9. The optical sensing apparatus of claim 8, wherein the carrier steerer is composed of the first material.

10. The optical sensing apparatus of claim 8, wherein at least a portion of the carrier steerer is composed of a second material.

11. The optical sensing apparatus of claim 10, wherein the first material comprises germanium, and wherein the second material comprises silicon.

12. The optical sensing apparatus of claim 9, wherein the first material comprises germanium or silicon.

13. The optical sensing apparatus of claim 1, comprising a plurality of pixels, one of the pixels comprising the absorption region and the carrier steerer.

14. A time-of-flight sensor comprising an emitter and the optical sensing apparatus of claim 1.

15. A mobile device comprising the optical sensing apparatus of claim 1.

16. A light detection method, comprising:
 during a first time period, configuring a first carrier steerer to direct holes created in an absorption region of an optical sensor to flow from the absorption region to a first p-doped region of the optical sensor and prevent electrons created in the absorption region from flowing from the absorption region to a first n-doped region of the optical sensor, the first n-doped region being electrically shorted with the first p-doped region;
 during a second time period, configuring the first carrier steerer to direct electrons created in the absorption region to flow from the absorption region to the first n-doped region and prevent holes created in the absorption region from flowing from the absorption region to the first p-doped region;
 receiving electrical signals from the optical sensor during the first and second times in response to the holes flowing to the first p-doped region during the first time period and the electrons flowing to the first n-doped region during the second time period; and
 processing the received electrical signals.

17. The light detection method of claim 16, further comprising
 during the first time period, configuring a second carrier steerer to prevent holes created in the absorption region from flowing from the absorption region to a second p-doped region of the optical sensor and direct electrons created in the absorption region to flow from the absorption region to a second n-doped region of the optical sensor, the second n-doped region being electrically shorted with the second p-doped region; and
 during the second time period, configuring the second carrier steerer to direct holes created in the absorption region to flow from the absorption region to the second n-doped region and prevent electrons created in the absorption region from flowing from the absorption region to the second p-doped region,
 wherein the electrical signals from the optical sensor are further in response to the electrons flowing to the second n-doped region during the first time period and the holes flowing to the second p-doped region during the second time period.

18. The light detection method of claim 16, wherein the first and second time periods are equal in length and are repeated multiple times.

19. The light detection method of claim 16, further comprising periodically emitting light towards an object in synchrony with the first and second time periods, wherein at least a portion of the light emitted during the first time period is reflected from the object and received at the absorption region during the second time period.

20. The light detection method of claim 19, wherein processing the received electrical signals further comprises determining information about a distance between the object and the optical sensor.

* * * * *